United States Patent [19]
Pate

[11] 3,991,370
[45] Nov. 9, 1976

[54] PEAK LIMITER

[76] Inventor: John Pate, 330 W. 45 St., New York, N.Y. 10017

[22] Filed: Oct. 3, 1975

[21] Appl. No.: 619,378

[52] U.S. Cl. .......................... 325/182; 179/1 VL; 325/150; 307/264; 328/175; 330/109
[51] Int. Cl.² .......................................... H04B 1/04
[58] Field of Search .......... 325/150, 187, 151, 182, 325/105; 333/14; 179/1 VL, 1 VC; 307/264; 328/169, 175; 330/132, 134, 142, 109, 110

[56] References Cited
UNITED STATES PATENTS

| | | | |
|---|---|---|---|
| 2,025,595 | 12/1935 | Kozanowski | 325/150 |
| 2,079,446 | 5/1937 | Goldsmith | 325/150 |
| 3,484,709 | 12/1969 | Kabrick | 325/105 |
| 3,582,964 | 6/1971 | Torick | 179/1 VL |
| 3,800,237 | 3/1974 | Fletcher et al. | 333/14 |
| 3,808,540 | 4/1974 | Kabrick | 325/187 |

Primary Examiner—Robert L. Griffin
Assistant Examiner—Michael A. Masinick

[57] ABSTRACT

A system for limiting the amplitude of electrical signals applied thereto includes a first feedback loop for reducing the gain of an amplifier to which the input signal is applied and a second feedback loop for providing a frequency dependent signal for returning the amplifier to its original gain. The time which is required for the amplifier to return to its original gain is dependent upon the frequency of the audio signal and the amplifier gain is restored to one of a plurality of fixed rates.

10 Claims, 6 Drawing Figures

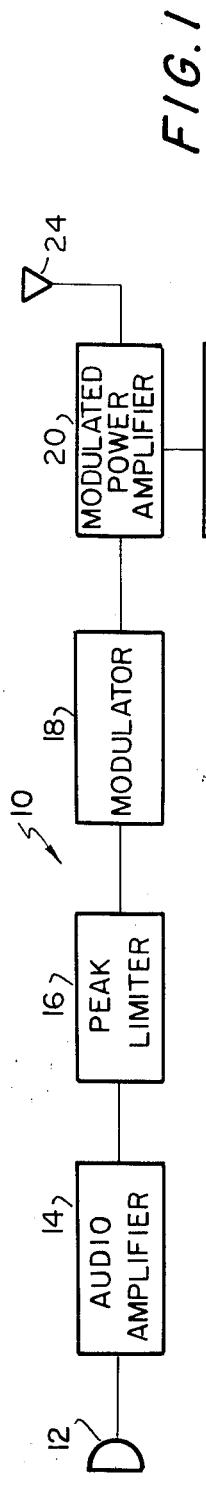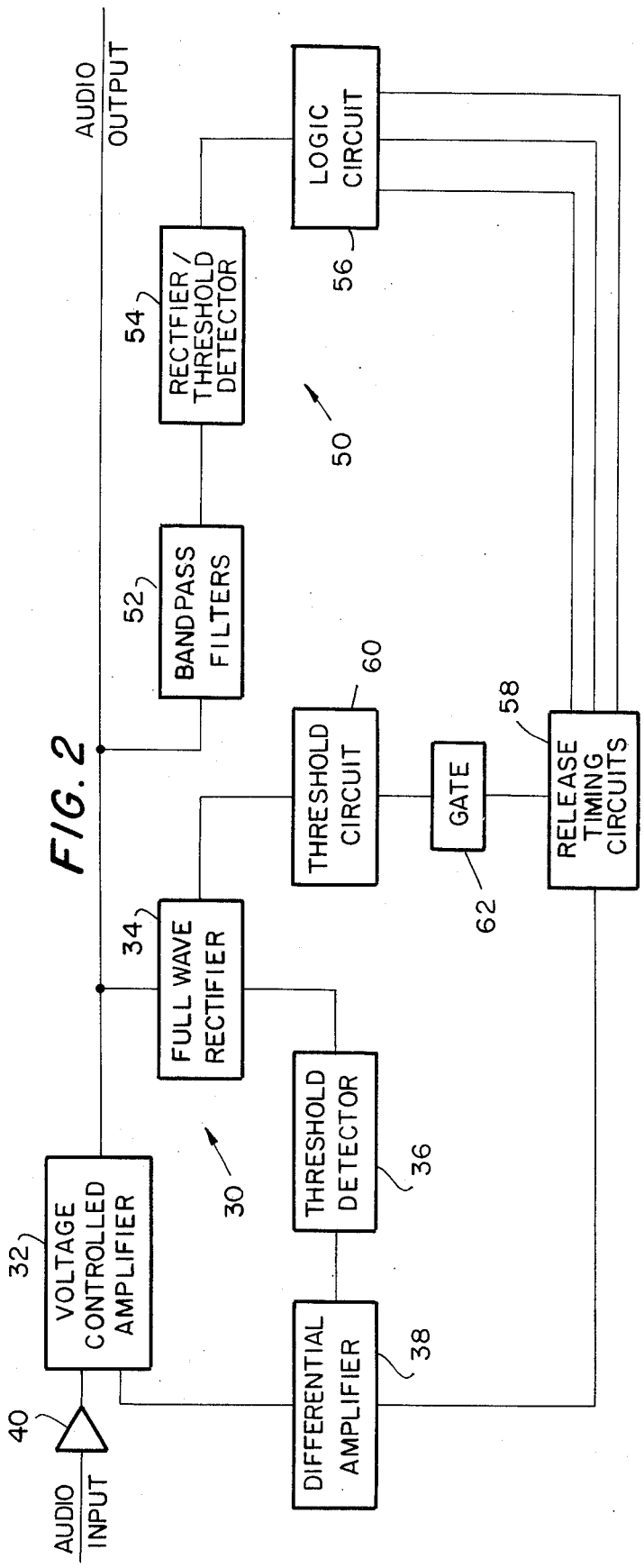

PEAK LIMITER

The invention relates to a system for limiting the amplitude range of electrical signals, and in particular to peak limiters for use in radio broadcast transmitters.

The operation of many electrical systems requires that the amplitude level of the output signal be maintained below a maximum amplitude without distortion. In radio broadcasting of audio signals the amplitude of the audio signal applied to the modulator must be below a maximum to prevent over-modulation of the audio carrier. In the past, peak limiters included a variable gain amplifier having a fixed gain for input audio signals below a threshold level. When the amplitude of the input signal exceeds the threshold level, the gain of the variable gain amplifier is reduced by an amount necessary to prevent the output signal from exceeding a preset level. When the amplitude of the input audio signal is again reduced below the threshold level, the gain of the variable gain amplifier is returned to its original value. The time required for the gain of the amplifier to be reduced is referred to as the "attack time", and the time required for the amplifier gain to return to its original, non-limiting value is referred to as the "release time."

Providing a properly controlled release time for the variable gain amplifier has been a problem in the past. On the one hand, it is desirable to have as fast a release time as possible so that all signals below the threshold amplitude are amplified to as great an extent as possible in order to maintain the highest average modulation of the carrier. On the other hand, too fast a release time can produce distortion, particularly in the low frequency signals. In practice, the rate of release has been fixed by the lowest frequency components of the audio signals.

Accordingly, it is an object of this invention to overcome the deficiencies in the prior peak limiters and particularly for peak limiters for use in conjunction of radio broadcast transmitters.

A more specific object of the present invention is to provide a peak limiter which has a variable release time. More particularly, it is an object of the invention to provide a peak limiter having a release time dependent upon the frequency content of the signal.

Another object of the invention is to provide such a peak limiter which is economical and relatively easy to operate.

These, and other objects of the invention, are realized in accordance with the invention by varying the release time of the peak limiter in accordance with the frequency content of the audio signal. In particular, it has been determined that the release time can be effectively controlled for audio signals in a radio broadcast transmitter by providing three frequency dependent release times; the slowest release time occurring when the input audio signal contains sufficient energy in a first frequency range; an intermediate release time for audio signals having sufficient energy above the first audio frequency range and in a second frequency range; and a fast release time for audio signals having energy only in a third frequency range higher than the second frequency range.

In one particular embodiment of the invention, in which the peak limiter is used in a radio broadcast transmitting system to prevent over-modulation of the audio carrier, the audio signal is applied from the audio signal source such as a tape player or microphone to a variable gain amplifier. The output audio signal from the amplifier is continuously monitored and the amplifier gain maintained at a constant level when the output audio signals are below a threshold level. When the amplitude of the applied audio signal exceeds the threshold, the gain of the variable gain amplifier is reduced through a first feedback network. When the gain is reduced, a second feedback network is activated to control the release time of the variable gain amplifier. In the second feedback loop the audio signal is divided into three frequency ranges: the first range being from about 30 hertz to about 100 hertz; the second range being from about 100 to 200 hertz and the third range being above 200 hertz. The amount of energy in each of these ranges is determined and a release time, slow, intermediate or fast, provided dependent upon the amount of energy in the low, intermediate or high frequency ranges respectively. In addition, a minimum time before release is provided to inhibit release is a steady state signal is applied to the input of the amplifier or if the envelope of the input signal is above the threshold and rising. The limited audio signal is then applied to the modulator wherein the audio carrier signal is modulated and then transmitted to distant receivers.

These and other features and objects of the invention will be better understood from the following detailed description taken in conjunction with the following drawings, in which:

FIG. 1 is a simplified block diagrammatic representation of an illustrative embodiment of the invention showing the peak limiter incorporated into an AM broadcast transmitter;

FIG. 2 is a block diagrammatic representation of the peak limiter of the invention;

Figure 3A:
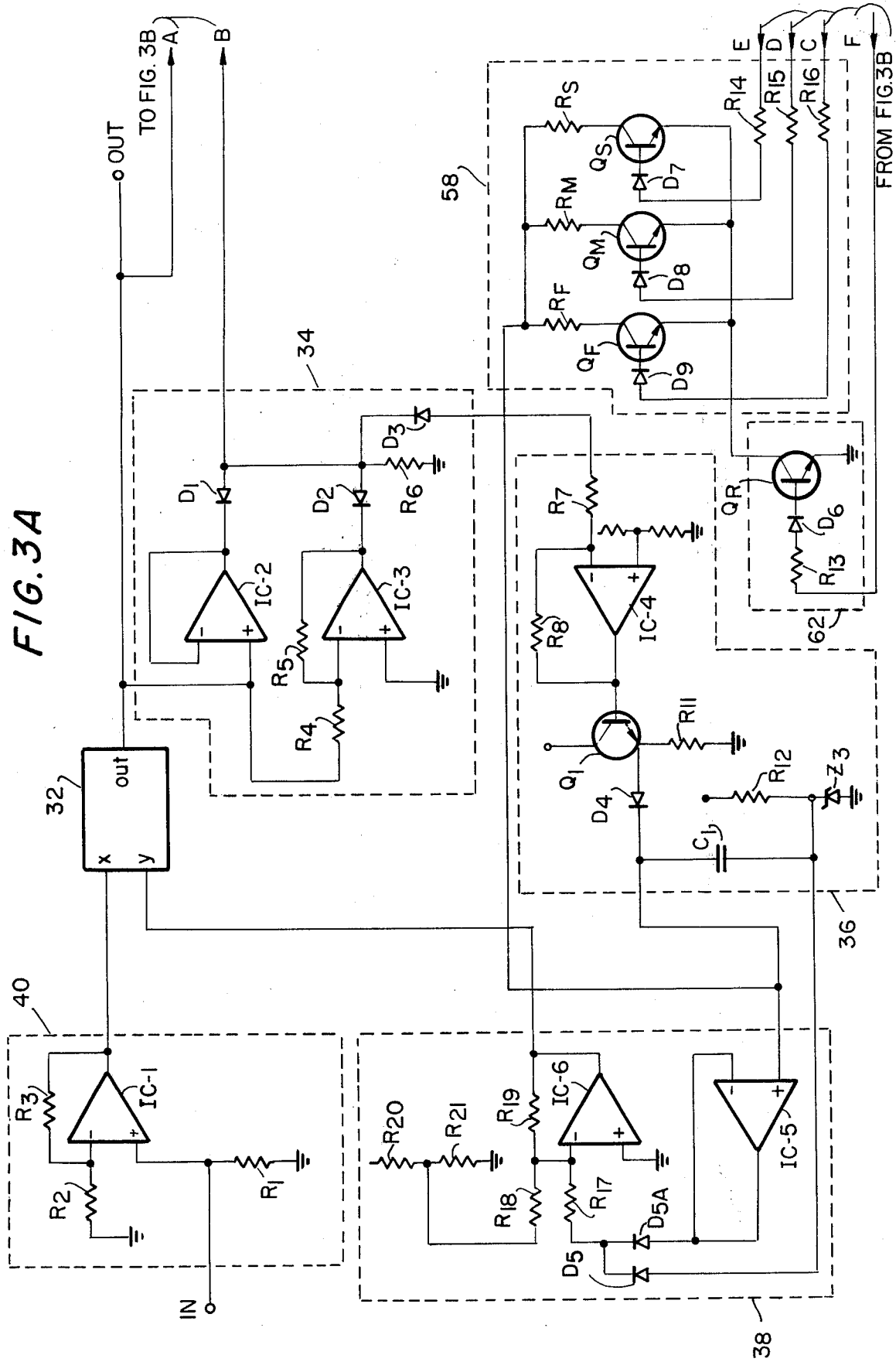
FIGS. 3A, 3B and 3C are diagrammatic representations of electrical circuits which can be used in the various blocks of the peak limiter of FIG. 2.

By way of illustration, the operation of the peak limiter of the invention will be described in detail as it is used to prevent over-modulation in an AM broadcast transmitter. Of course, there are many other and varied applications for this peak limiter as will be readily understood and apparent to those skilled in the art.

Referring to FIG. 1, there is illustrated an AM broadcast transmitter 10. Audio information is fed via microphone 12 and audio amplifier 14 to peak limiter 16. The peak limiter limits the amplitude of the audio signal to a predetermined maximum level, as will be explained below. The audio signal is then applied to modulator 18 which drives modulate power amplifier 20 wherein the audio signal modulates the carrier wave provided by oscillator 22 and is transmitted via antenna 24 to distant radio receivers.

In the AM transmitter, it is desirable to have the audio information applied to the modulator at as high a level as possible consistent with the maximum power allocations of the particular station. However, if the audio signal is too great, it will over-modulate the carrier. The peak limiter includes an amplifier having a fixed gain for output audio signals below a threshold level. When an output audio signal having amplitude greater than the threshold is applied to peak limiter, a feedback circuit automatically reduces the gain of the amplifier sufficiently to limit the amplitude of the audio signal applied to the modulator to the threshold level. When the amplitude of the output audio signal is again below the threshold, the amplifier gain is returned to the original fixed level. In the peak limiter of the invention, the release time is dependent upon the frequency content of the output audio signal. In the particular embodiment described and illustrated herein, when no audio frequency energy below 200 hertz is present in the input audio signal, the peak limiter has the fastest release time, typically 13 milliseconds per decibel (ms/db) of release. When energy of sufficient amplitude between 100 and 200 hertz is present the release time is slowed to about 26 ms/db of release. When energy in the range of 100 hertz or below is present, the release time is slowed to about 52 ms/db of release. In this manner, the peak limiter release time is made as short as possible without producing distortion of the low frequency signals.

Referring now to FIG. 2, there is shown in block diagrammatic form an embodiment of the peak limiter of the invention. The peak limiter includes a first feedback loop, generally designated by reference numeral 30 for maintaining the gain of the voltage controlled amplifier 32 at a fixed value so long as the audio output signal is less than the threshold and for decreasing the gain of amplifier 32 by an amount dependent upon the magnitude by which the output audio signal exceeds the threshold to maintain the output audio signal below the maximum allowable level. As shown, feedback loop 30 includes a full wave rectifier 34, a threshold detector 36 and a differential amplifier 38. In operation, the audio input information is applied through an isolation and gain control circuit 40 to the voltage controlled amplifier 32. The output of amplifier 32 is applied to full wave rectifier 34 which rectifies the audio signal. This rectified signal is applied to threshold detector 36 which produces an output signal when the rectified audio signal exceeds a predetermined level. This output signal is applied to differential amplifier 38 which provides a DC output voltage having a magnitude directly related to the magnitude of the output audio signal. The DC voltage is applied to reduce the gain of amplifier 32 to a value to effectively limit the audio output signal level.

The peak limiter also includes a second feedback loop, generally designated by reference numeral 50 variably controlling the release time of amplifier 32 after the gain of amplifier 32 has been reduced. Feedback loop 52 generally operates to separate the audio signals into various frequency bands; determine the amount of energy in each of the bands; and apply a signal to differential amplifier 38 to change the DC output signal to the amplifier 32 to restore amplifier 32 to its previous fixed gain condition.

To this end, two band pass filters designated by reference numeral 52 have pass bands in the frequency ranges of about 30–100 hertz and 100–200 hertz respectively. Rectifier and threshold detector 54 provides signals which are dependent upon the amount of energy in each of the frequency bands. These signals are combined in a logic circuit which produces one of three output signals dependent upon the energy content of the output audio signal. The output signal is applied through release timing circuit 58 to differential amplifier 38 to control the release of amplifier 32. Release timing circuit 58 also provides a minimum time before release under the control of circuit 60 and gate 62.

In this manner, the time before release of amplifier 32 is controlled to be a pre-set minimum and a subsequent variable release time in accordance with the frequency content of the audio output signal.

Figure 3B:
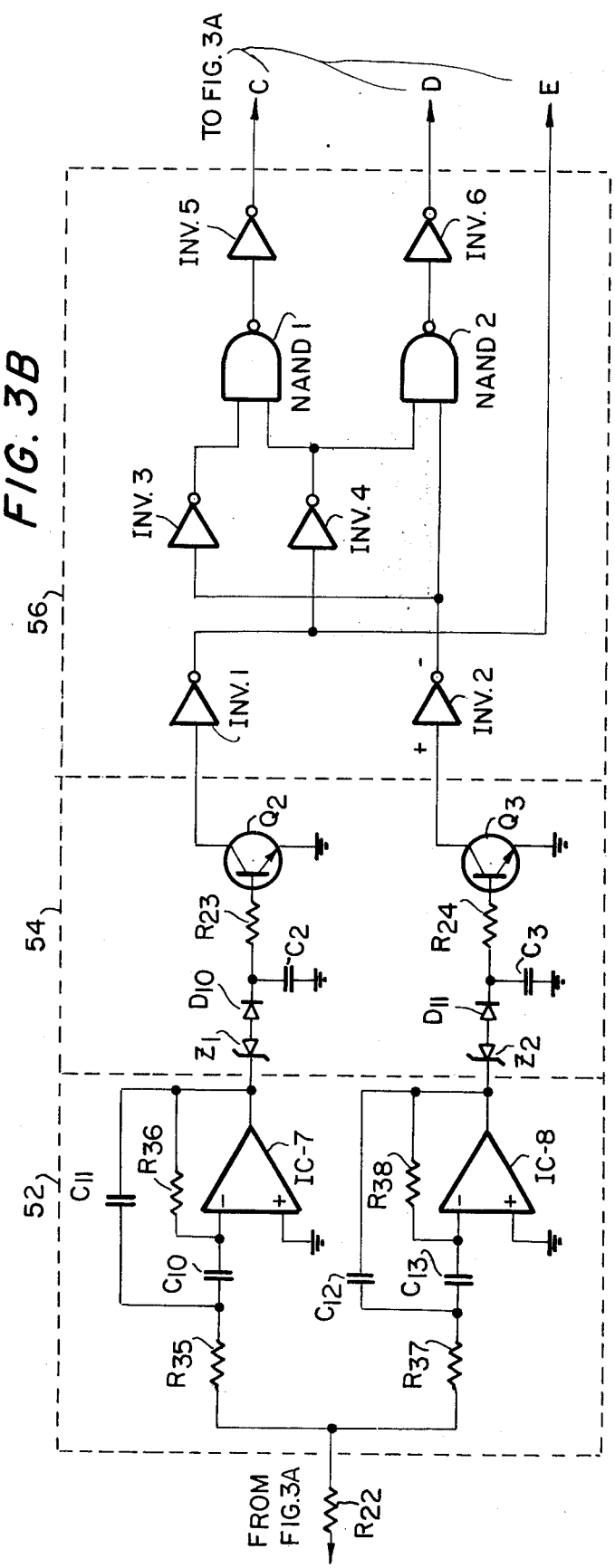

Referring now to FIGS. 3A and 3B, there is shown typical electrical circuits which can be utilized in each of the blocks of FIG. 2. The circuits shown in FIGS. 3A and 3B are conventional integrated circuits known to those skilled in the art and found in many standard reference works for integrated circuit applications. One such reference work is entitled *Understanding IC Operational Amplifiers* by Roger Melen and Harry Garland, published by Howard W. Sams & Co., Inc. (First Edition, 1973). The operation of each of the integrated circuits will not be described in detail, it being assumed that such detailed operation will be readily apparent to those skilled in the art.

As shown, the input audio signal is applied to the non-inverting input of IC-1 of isolation and gain circuit 40. The output of circuit 40 is applied to the "X" input of a four-quadrant multiplier arranged to operate as a voltage-controlled amplifier 32. The output of the amplifier 32 is applied to a band pass filter 34 including two parallel connected operational amplifiers, IC-2 and IC-3, and associated resistors R4-R5. The outputs of the operational amplifiers are coupled to the cathodes of diodes D1 and D2, the anodes of which are connected together and through R6 to ground to produce a full wave rectified signal. This full-wave rectified signal is applied through diode D3 and resistor R7 to the inverting input of operational amplifier IC-4 which is part of threshold detector 36. The non-inverting input of operational amplifier IC-4 is coupled to a fixed negative voltage so that operational amplifier IC-4 operates as a threshold detector. When the input voltage to the inverting input of IC-4 is above the threshold, i.e., above the voltage at the non-inverting input, a voltage appears at the base of transistor Q1, turning Q1 "on" and charging capacitor C1. This voltage, in turn, is coupled to the noninverting input of IC-5 of differential amplifier 38, the output of IC-5 is coupled to the inverting output of operational amplifier IC-6 through resistor R-17 and diode D5A and also fed back to the inverting input of IC-5. The inverting input of IC-6 is also coupled to ground via diode D5 and zener diode Z3. the inverting input is also coupled via resistors R18, R20, R21 to a source of DC voltage. The output from IC-6 is a DC voltage which is applied to the "Y" input of voltage-controlled amplifier 32 via resistor R19 to decrease the gain of amplifier 32 by an amount dependent upon the magnitude of such DC voltage which, in turn, is dependent upon the magnitude of the output audio signal.

Figure 3C:
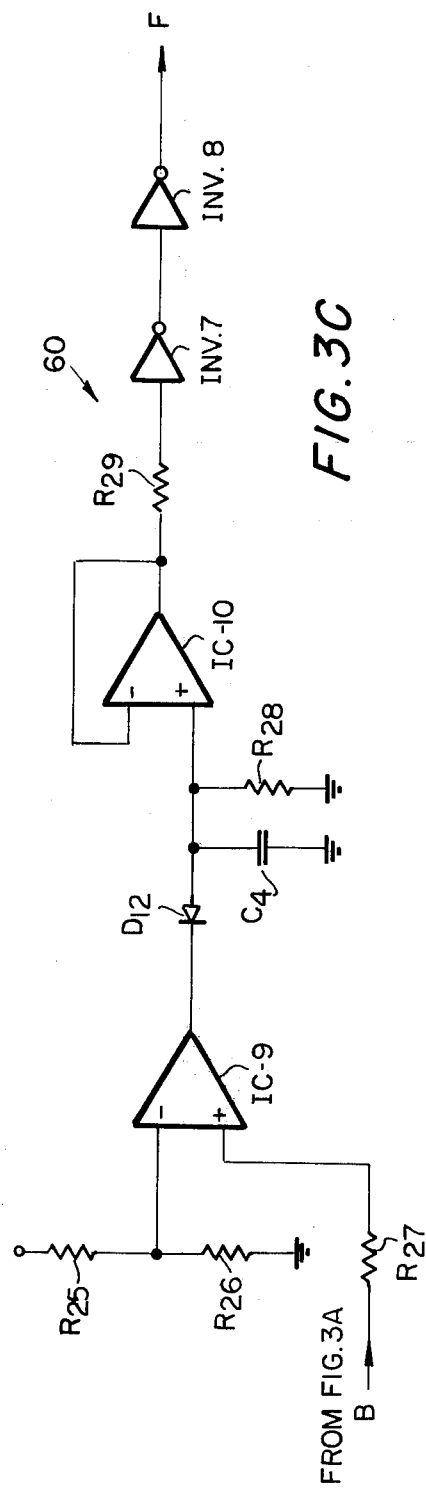

The output of rectifier 34 is also applied via lead B and resistor R27 (see FIG. 3C) to the non-inverting input of operational amplifier IC-9 to the threshold circuit 60. A fixed potential is applied to the inverting input to IC-9 via resistor R25-R26. The output from IC-9 is applied via diode D12 to timing circuit C4-R28 and operational amplifier IC-10 to provide a minimum time before release, typically 20 milliseconds. The output of IC-10 is applied through two inverters, INV-7 and INV-8, to provide a binary output signal at lead F. The signal on lead F is applied to the base of transistor $Q_R$ via resistor R13 and diode D6 of gate circuit 62 (FIG. 3A). When $Q_R$ is turned on, ground is applied to the emitters of transistors $Q_F$, $Q_M$ and $Q_S$ in release timing circuits 58 through the collector emitter circuit of transistor $Q_R$ permitting operation of these transistors to provide the variable release time for amplifier 32 as will now be explained.

The output of the audio signal is also applied via lead A (FIG. 3A) and resistor R22 to the input of band pass filter 52 (FIG. 3B). As shown, the band pass filter includes two operational amplifiers, IC-7 and IC-8. Operational amplifier IC-7 and associated resistors R35, R36 and capacitors C10 and C11 are arranged to provide a pass band in the range of about 30–100 hertz. Operational amplifier and associated resistors R37, R38 and capacitors C12, C13 are arranged to provide a pass band in the range of about 100–200 hertz. The output of each band pass filter is applied to a threshold detector, such as zener diodes Z-1, Z-2 respectively, and then to envelope detectors D10, C2, R23 and D11, C3 and R24, respectively. Thus the signal applied to the base of transistor Q2 and Q3 are related to the amount of energy in the pass bands of the two band pass filters. If the audio signal has predetermined energy in the range 30–100 hertz, Q2 is turned "on". If the audio signal has a predetermined amount of energy in the pass band of 100–200 hertz, transistor Q3 is turned on.

The gain and selectivity of bandpass filters 52 and threshold of operation of the threshold circuits determine the level at which Q-2 and Q-3 turn on at various frequencies. It is desirable to have a slower release speed if a low frequency component is present in a substantial amount. Since voice and music audio signals are complex waveforms having many different frequency components at various levels present simultaneously, a low frequency component may exist at an amplitude which, if present as a single frequency tone, would not exceed the threshold of limiting and therefore would not produce limiting. When, however, this low frequency component is present together with one or more components which are of sufficient amplitude to cause limiting action, its presence should be allowed for in determining release speed. For this reason, the bandpass filters are made sensitive enough to operate the threshold devices and turn on Q-2 and Q-3 at levels which, if present as single frequencies, might not exceed the threshold of limiting. The bandpass filters are not made so sensitive however, that they would operate the threshold circuits on low frequency components which are too weak to be of significance. The sensitivities of the bandpass filter/threshold circuits are such that generally an increasing "weighting" is given to the lower frequencies; i.e., the sensitivity of operation increases as the frequency of the components of the audio signal decreases. The specific "weighting" may vary depending upon the amount of low frequency distortion which is acceptable in a particular application of the invention. A typical "weighting" characteristic for a peak limiter for use in an AM transmitter is shown in FIG. 4.

Figure 4:
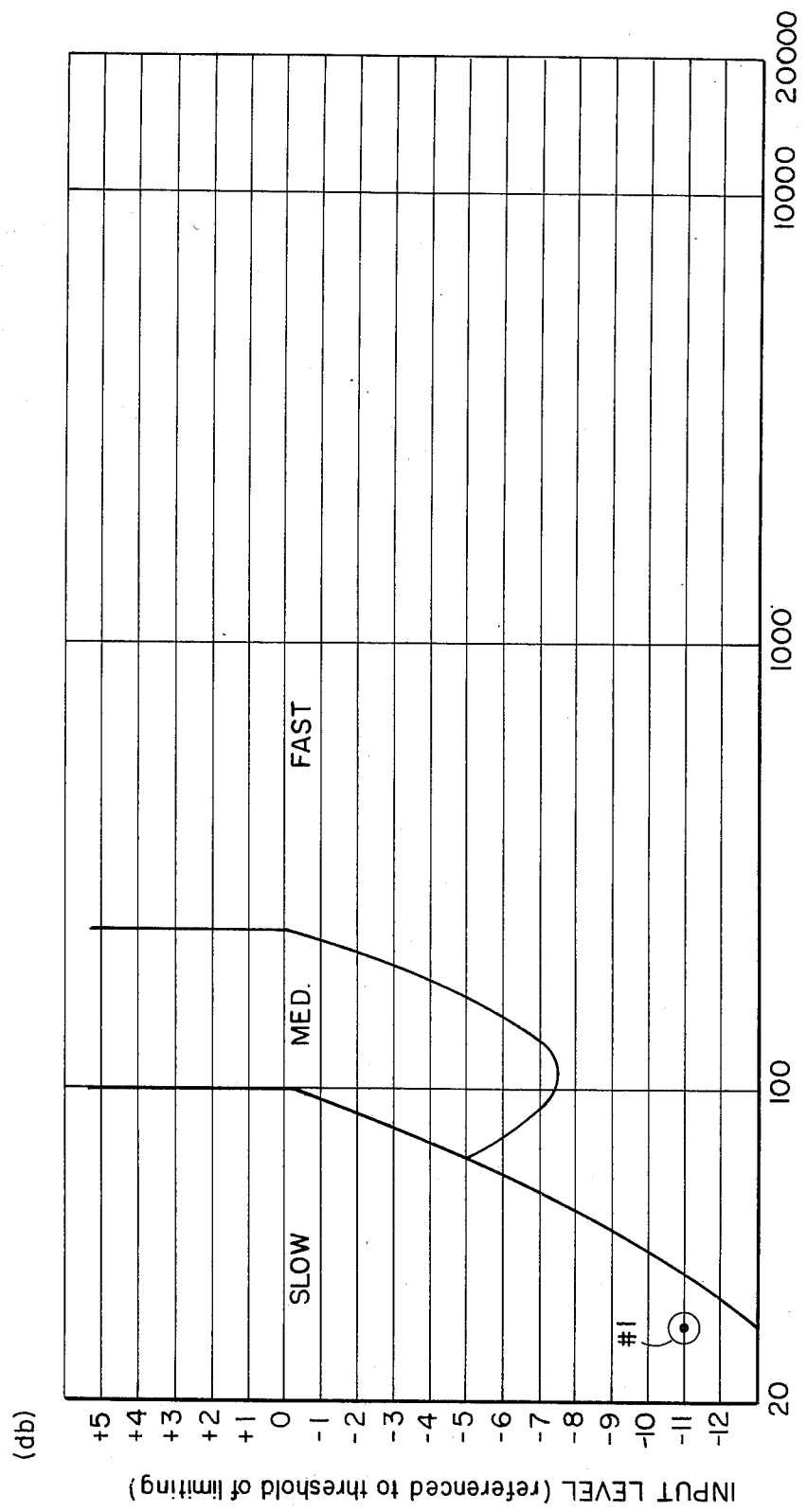
FIG. 4 is a graphical representation showing the release speed as a function of amplitude and frequency of audio input signals.

Referring now to FIG. 4, there is shown the response of the release time for a single frequency input signal. The frequency of the signal, in hertz, is plotted along the abscissa, and the audio level to the input of the voltage controlled amplifier 32 is plotted, in db, along the ordinate. The ordinate is referenced to the input level at which limiting occurs. For example, 0 db is the highest audio input level at which no limiting occurs. The positive input levels indicate input audio signals of sufficient energy to produce limiting. The negative input levels indicate audio input levels which having only a single frequency component would not by themselves be sufficient to cause limiting, however, if part of an input signal which is of sufficient energy to cause limiting must be considered in the release time.

Referring to the upper portion of the graph of FIG. 4 (above 0, db input level), if one of the components of the audio input signal is above the threshold of limiting and between about 30 and 100 hertz, the release time is slow; if the audio frequency component is between about 100 and 220 hertz and above the threshold of limiting, and there are no components below 100 hertz, medium release time occurs; and if there are no components of the audio signal below 220 hertz, a fast release time occurs.

However, an audio input signal which has produced limiting may have low frequency components which are significant in determining the release time. This is shown in the lower half of the graph of FIG. 4. For example, a component of an audio signal at 30 hertz which by itself is 11 db below the level necessary for limiting (pt. 1 on FIG. 4) will not, by itself, produce limiting. The passband of filter 52 is arranged so that a signal component having the frequency and level of point 1, FIG. 4, would be sufficient to produce a slow release time for the circuit. The bandpass filter characteristics and logic circuits are arranged to produce the release times indicated in FIG. 4 for all components of the input audio signal. The collectors of transistors Q2 and Q3 are coupled respectively to inverters INV-1 and INV-2 of logic circuit 56. The logic circuit is arranged to provide one of three output signals, which appears respectively on leads C, D or E, dependent upon the energy content of the output audio signal. If there is no energy in the audio signal below 200 hertz, both transistors Q2 and Q3 are non-conducting and an output signal appears on lead C. If there is a predetermined energy in the audio signal in the range 30–100 hertz, a signal appears on lead E. If there is a predetermined energy in the audio signal in the range 100–200 hertz, but not in the 30–100 HZ range a signal appears on lead D.

Leads C, D and E are coupled to bases of transistors $Q_F$, $Q_M$ and $Q_S$, respectively in release circuits 58 (FIG. 3A). A signal, appearing on one of these leads, turns on the respective transistor thereby effectively coupling one of the collector resistors RF, RM or RS across capacitor C1. Capacitor C1 discharges through the resistor, reducing the voltage to the differential amplifier and restoring the full gain to amplifier 32. Thus, by appropriate choice of the resistors RF, RM, RS, the release time for amplifier 32 is controlled.

Obviously, any modifications and variations of the present invention are possible in light of the above teachings. Specifically, the peak limiter need not have a fixed minimum time before release. Also, the specific electronic circuits may be changed, as is well known in the art. It is therefore to be understood that within the scope of the appended claims, the invention may be practiced otherwise than it is specifically described.

What I claim is:

1. An improved radio transmission system for broadcasting audio information to a distant receiver by modulating a carrier with said audio information comprising means to prevent overmodulation of the carrier including a limiting means consisting of a variable gain means and an amplitude detection means for controlling the gain of said variable gain means in such a way that said limiting means tends to create a uniform or constant amplitude of said audio information, means for applying said audio signals to the input of said limiting means, first detection means for detecting the occurrence of a condition where the peak amplitude of said audio information is above a predetermined threshold level to produce a signal to decrease the gain of said variable gain means, and second detection means for detecting said audio information and providing an electrical signal indicative of the frequency and amplitude of said audio information, means for coupling said electrical signal to said variable gain means for varying the rate of recovery of gain of said varible gain means in accordance with the frequency and amplitude of said audio signals.

2. The system of claim 1 wherein said second detection means includes timing means for providing a preselected rate of recovery of gain dependent upon the frequency and amplitude of said audio signals.

3. An improved radio transmission system for broadcasting audio information to a distant receiver by modulating a carrier with said audio information, the improvement comprising means to prevent overmodulation of the carrier including limiting means, means for applying said audio information to said limiting means, means coupled to the output of said limiting means for reducing the gain of said limiting means in response to the amplitude of said audio signals and control means coupled to the output of said limiting means for controlling rate of recovery of gain of said limiting means in accordance with the frequency of said audio signal.

4. The system of claim 3 further including signal amplitude responsive means coupled to the output of said frequency selective network for responding to the amplitude of the signal from the frequency selective network and providing an output signal therefrom when the amplitude exceeds a threshold value.

5. The system of claim 3 wherein said control means include the frequency selective network coupled to receive the audio signals and produce at least one signal indicative of the frequency content of said audio signals and means coupled to the output of said frequency selective network and to the input of said limiting means for varying the release time of said limiting means in accordance with the frequency of said audio signals.

6. The system of claim 5 wherein the frequency selective network includes a bandpass filter.

7. The system of claim 3 wherein said control means includes a feedback loop coupled between the output and input of said limiting means, said feedback loop including means for separating said audio signals into predetermined frequency ranges.

8. The system of claim 7 wherein said feedback loop further includes means coupled to said separating means for providing a signal indicative of the amplitude of each audio signal in said predetermined ranges.

9. The system of claim 8 wherein said feedback loop further includes means coupled to said amplitude determining means for providing a rate signal indicative of the amount of energy present in the lowest predetermined frequency range and means for coupling said rate signal to said limiting means for controlling the rate of recovery of gain of said limiting means.

10. The system of claim 9 wherein said signal coupling means includes means for providing a minimum time during which the gain of said limiting means is reduced before the recovery of gain is begun.

* * * * *